(12) United States Patent
Roehr

(10) Patent No.: US 7,355,898 B2
(45) Date of Patent: Apr. 8, 2008

(54) INTEGRATED CIRCUIT AND METHOD FOR READING FROM RESISTANCE MEMORY CELLS

(75) Inventor: Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 209 days.

(21) Appl. No.: 11/227,429

(22) Filed: Sep. 16, 2005

(65) Prior Publication Data
US 2006/0067147 A1 Mar. 30, 2006

(30) Foreign Application Priority Data
Sep. 17, 2004 (DE) .................. 10 2004 045 219

(51) Int. Cl.
*G11C 11/34* (2006.01)
*G11C 16/04* (2006.01)
(52) U.S. Cl. ................ 365/189.01; 365/203; 365/207; 365/148
(58) Field of Classification Search ........... 365/189.01, 365/203, 207, 148
See application file for complete search history.

(56) References Cited

U.S. PATENT DOCUMENTS

| 6,396,733 B1 | 5/2002 | Lu et al. |
| 6,501,697 B1 | 12/2002 | Perner et al. |
| 6,785,156 B2 | 8/2004 | Baker |
| 2002/0071306 A1 | 6/2002 | Thewes et al. |
| 2002/0093848 A1 | 7/2002 | Thewes et al. |
| 2003/0128612 A1* | 7/2003 | Moore et al. ............... 365/222 |
| 2003/0156468 A1 | 8/2003 | Campbell et al. |
| 2003/0209728 A1 | 11/2003 | Kozicki et al. |
| 2003/0209971 A1 | 11/2003 | Kozicki et al. |
| 2004/0027874 A1 | 2/2004 | Baker |
| 2005/0018493 A1* | 1/2005 | Casper et al. .......... 365/189.07 |
| 2005/0018509 A1* | 1/2005 | Hush et al. .................. 365/205 |

FOREIGN PATENT DOCUMENTS

| DE | 100 36 140 C1 | 12/2001 |
| WO | WO 2004/102577 A1 | 1/2004 |

OTHER PUBLICATIONS

M.N. Kozicki et. al, "Can Solid State Electrochemistry Eliminate the Memory Scaling Quandary?" Proceedings IEEE-NANO 2002.
R. Symanczyk et al, "Electrical Characterization of Solid State Ionic Memory Elements," Proceedings NVMTS2003.

* cited by examiner

*Primary Examiner*—Anh Phung
*Assistant Examiner*—Toan Le
(74) *Attorney, Agent, or Firm*—Dicke, Billig & Czaja, PLLC

(57) ABSTRACT

A method and apparatus for reading from a memory arrangement, in particular, for reading from a CBRAM or another memory arrangement based on resistively switching memory cells includes charging a bit line to a voltage value, discharging the bit line by a cell resistance, and subsequently assessing a resulting voltage difference in a measuring device, in particular, a differential sense amplifier.

29 Claims, 14 Drawing Sheets

- A redox reaction drives metal ions from the reactive anode into the chalcogenide glass
- Metal-rich accumulations are formed
- A conductive bridge between the top and bottom electrodes arises Anode

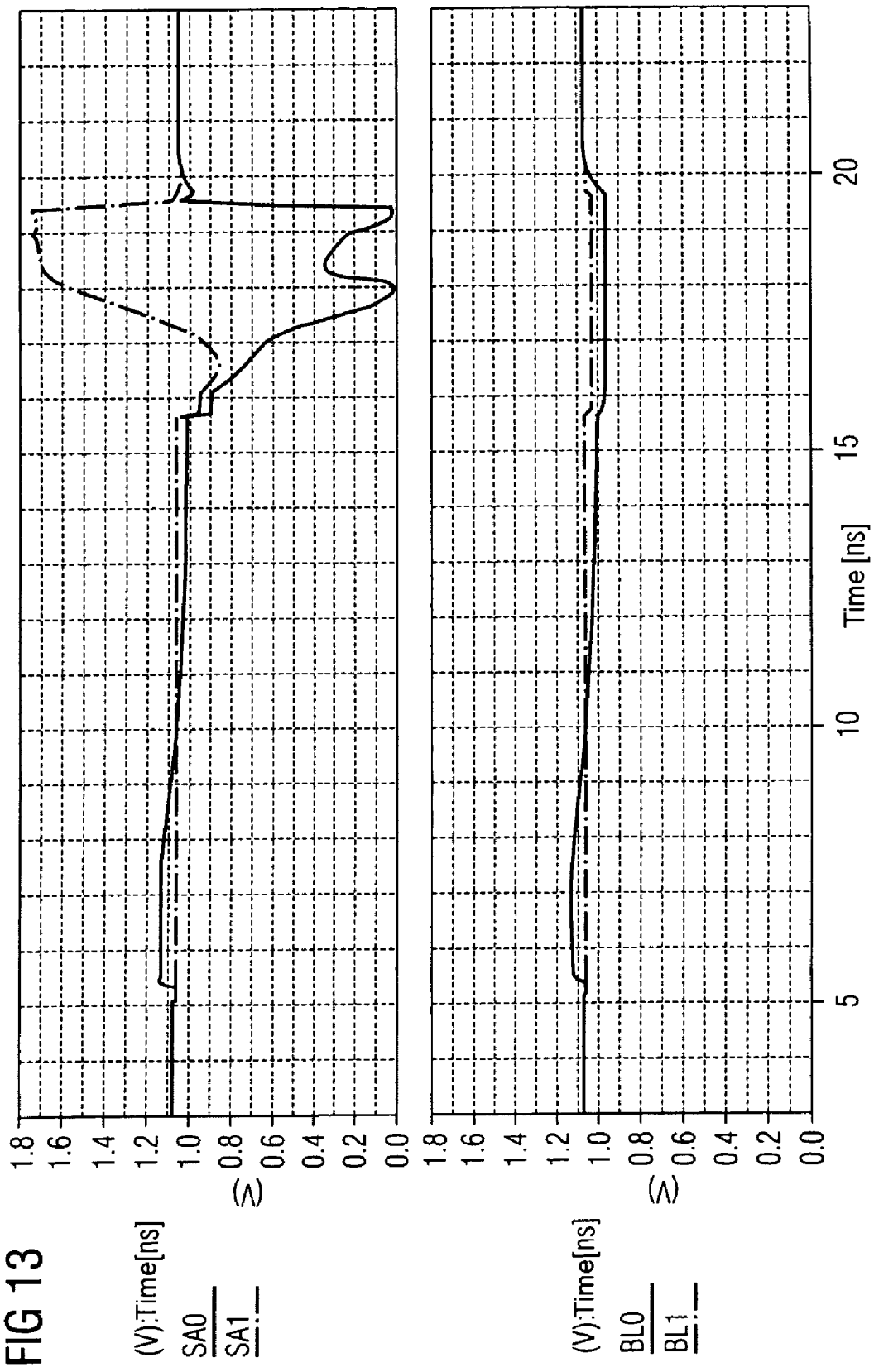

INTEGRATED CIRCUIT AND METHOD FOR READING FROM RESISTANCE MEMORY CELLS

CROSS REFERENCE TO RELATED APPLICATIONS

This application claims priority under 35 USC § 119 to German Application DE 10 2004 045 219.9, filed on Sep. 17, 2004, entitled "Arrangement and Method for Reading From Resistance Memory Cells," the entire contents of which are hereby incorporated by reference.

FIELD OF THE INVENTION

The invention relates to a method for reading from a memory arrangement, in particular for reading from a CBRAM or some other memory arrangement based on resistively switching memory cells, and to a corresponding apparatus.

BACKGROUND

Semiconductor memories comprising resistively switching elements for storing information are being developed to an increasing extent. One possible embodiment of such resistive memory cells is the CB contact, which is also known as CBJ (CBJ="conductive bridging junction"). This utilizes the formation of a conductive channel in an insulating carrier material. Such a memory cell can be programmed, i.e., written or erased, by applying suitable voltage pulses. CBRAM memory arrangements are based on the CB memory cell.

Other possible resistively switching memory technologies are polymer-based memories or the phase change RAM (e.g., based on GeSbTe, germanium antimony tellurite), in which a resistance that is dependent on a crystal structure is utilized.

When reading such memory cells, it is necessary to determine the resistance of the cell. A small space requirement and a high access speed are demanded for practical applications in memory circuits.

The technologies discussed above have only recently arisen or been researched with regard to the possibility of their commercial application. Neither read-out methods nor read-out apparatuses, which satisfy the present-day and the expected requirements of commercial utilization, have hitherto been disclosed for such memory cells.

In view of this deficiency of the prior art, an apparatus and a method suitable for reading from a memory arrangement, in particular, for reading from a CBRAM or another memory arrangement based on resistively switching memory cells, are desirable.

SUMMARY

An apparatus and a method suitable for reading from a memory arrangement, in particular, for reading from a CBRAM or another memory arrangement based on resistively switching memory cells, according to the present invention, includes connecting a first pole of a memory cell to a positive charge source with a first potential, connecting a second pole of a memory cell to a conductor having a second potential, which lies below the potential of the charge source, and measuring the potential of the conductor.

If the resistance between the first and second poles is small, then positive charge carriers migrate in a correspondingly large number from the charge source to the conductor and cause the originally lower potential of the conductor to be matched to the first potential. In the invention, a positive charge source is equated with a negative charge sink. In the case of the negative charge sink, if the resistance between the first and second poles is small, negative charge carriers migrate in a correspondingly large number from the conductor to the charge sink and cause the originally lower potential of the conductor to be matched to the first potential. If the resistance between the first and second poles is large, then positive charge carriers migrates in a correspondingly small number from the charge source to the conductor, and the potential of the conductor is not matched to the first potential.

This also applies in the case of CB memory cells, whose OFF resistance, i.e., resistance in a high-resistance state, lies in the range of $10^{10} \ldots 10^{11}$ Ω and whose ON resistance, i.e., resistance in a low-resistance state, is approximately $10^4 \ldots 10^5$ Ω.

Accordingly, by measuring the potential of the conductor, it is possible to determine whether the memory cell is in a high-resistance or low-resistance state.

Another apparatus and method suitable for reading from a memory arrangement, in particular, for reading from a CBRAM or another memory arrangement based on resistively switching memory cells, according to the present invention, includes connecting a first pole to a positive charge sink with a first potential, connecting a second pole to a conductor having a second potential, which lies above the potential of the charge sink, and measuring the potential of the conductor.

In this case, the invention functions according to an opposite principle compared to the above description. If the resistance between the first and second poles is small, then positive charge carriers migrate in a correspondingly large number from the conductor to the charge sink and cause the originally higher potential of the conductor to be matched to the first potential. In the invention, a positive charge sink is equated with a negative charge source. In the case of the negative charge source, if the resistance between the first and second poles were small, negative charge carriers would migrate in a correspondingly large number from the charge source to the conductor and cause the originally higher potential of the conductor to be matched to the first potential. If the resistance between the first and second poles is large, then positive charge carriers can only migrate in a correspondingly small number from the conductor to the charge sink, and the potential of the conductor is not matched to the first potential.

In accordance with the above explanation, it is possible, by measuring the potential of the conductor, to determine whether the memory cell is in a high-resistance or low-resistance state. This is also applicable in the case of CB memory cells. Consequently, the apparatus and method according to the invention are suitable for reading from a memory arrangement including at least one memory cell in which a resistance value between two poles of the memory cell reflects a memory state of the memory cell, and the two poles respectively correspond to the abovementioned first and second poles of the memory cell.

For example, the conductor is brought to the second potential after connection to the other pole of the memory cell (the boost operation). The conductor may likewise be brought to the second potential prior to connection to the other pole of the memory cell (the precharge operation). The conductor is not held permanently at the second potential in order to match and measure the potential of the conductor to the first potential. In other words, the manner in which the conductor is set to the second potential must not have the effect that matching the potential of the conductor to the first potential cannot occur in the given case. Such non-occurrence of the voltage matching might occur, for example, when the conductor is operated in continuous boost operation by a charge source that generates more charges per unit of time than can be "absorbed" by a charge sink connected to the first pole of the memory cell. From the above explanations, other additional unfavorable configurations and modes of operation, i.e., distinguish between favorable and unfavorable configurations or modes of operation, can be recognized by persons skilled in the art.

For the precharge operation, the conductor may, for example, be brought, i.e., charged, to the second potential by a precharge circuit before being connected to the other pole of the memory cell by a switch arrangement. The precharge circuit may have, for example, a charge source and a potential regulating or control apparatus that regulates or controls the charge source and/or the flowing of charges from the charge source to the conductor such that the conductor is charged to the second potential. The switching arrangement may include a corresponding switched switching transistor, for example. According to the invention, the precharge circuit and the switching arrangement are operated, for example, by a corresponding supervisory apparatus such that the conductor is charged to the second potential before the switch arrangement produces a connection between the conductor and the corresponding pole of the memory cell.

The conductor is, for example, brought to the second potential by a voltage pulse coupled capacitively. In this way, the desired potential can be set without causing an excessive charge flow, as described above, that prevents a voltage matching. The capacitive coupling may be effected, for example, by a capacitor or by a MOS transistor that is connected as a capacitor.

The first and second potentials are selected, for example, such that the magnitude of their difference does not exceed the sum formed from the magnitude of a positive threshold voltage and the magnitude of a negative threshold voltage. The positive threshold voltage is that positive voltage applied to the two poles of the memory cell, as seen statistically, that causes a resistance change that characterizes a change in the memory state of the memory cell, and the negative threshold voltage is that negative voltage applied to the two poles of the memory cell, as seen statistically, that causes a resistance change that characterizes a change in the memory state of the memory cell. The first and second potentials are selected, for example, such that the magnitude of their difference is less than $2/3$ and greater than $1/3$, in particular, less than $5/8$ and greater than $3/8$, in particular equal to $1/2$ of the sum formed from the magnitude of the positive threshold voltage and the magnitude of the negative threshold voltage.

CBRAM and other memory arrangements based on resistively switching memory cells typically have both a positive and a negative threshold voltage that are applied to corresponding poles of the memory cell that affect a change in the memory state of the memory cell (in the unfavorable case, even through permanent damage to the memory cell). These threshold voltages are often not precisely determinable voltages, but rather may depend in hysterese-like fashion, for example, on preceding states of the memory cell. It is correspondingly expedient to ascertain these threshold voltages statically. If the first and second potentials are chosen such that the magnitude of their difference does not exceed the sum formed from the magnitude of the positive threshold voltage and the magnitude of the negative threshold voltage, then it is possible to prevent an undesirable change in the memory state of the memory cell during determination of the memory state. This is applicable particularly when the first and second potentials are chosen such that the magnitude of their difference is significantly less than the sum formed from the magnitude of the positive threshold voltage and the magnitude of the negative threshold voltage. However, if the first and second potentials are chosen such that the magnitude of their difference is small, then it is more difficult to identify a possible matching of the potential of the conductor to the first potential.

The potential of the conductor is measured, for example, by a two-pole differential amplifier. One pole is connected to the conductor and the other pole is held at a third potential between the first and second potentials. The third potential is, for example, equal to the mean value of the first and second potentials.

Since the present invention determines whether a memory cell is in a high-resistance or in a low-resistance state in binary fashion, differential amplifiers are suitable for the measuring operation. This is applicable particularly if the reference potential of the differential amplifier is approximately the mean value of the first and second potentials. Differential amplifiers having a high gain factor (for example, an order of magnitude of 100 to 1000) supply an advantageously rapid statement about a possible matching of the conductor potential to the first potential. It is also possible, of course, for other types of amplifier to be used successfully.

If an asymmetrical behavior of the differential amplifier is desired, for example, in order to compensate for an asymmetrical behavior of the read-out apparatus according to the invention depending on the state of the memory cell, then it may be expedient to choose a reference potential that differs significantly from the mean value of the first and second potentials.

The conductor is, for example, first brought to the third potential and then to the second potential. Such a procedure that is redundant per se can ensure that the differential amplifier supplies an unambiguous result only when the conductor has actually been brought successfully in the direction of the second potential. In other words, remanent voltages from a preceding determination of the memory state of the memory cell, i.e., from a preceding read-out operation, are prevented from influencing the present determination of the memory state.

The current flow of the current source or sink is, for example, restricted to a value lying below the magnitude of a harmful and/or destructive current.

In CBRAM and other memory arrangements based on resistively switching memory cells, the flowing of an excessively large current through the memory cell typically leads to an undesirable state change or even to permanent damage to the memory cell. The magnitude of the currents often cannot be determined precisely, but rather depends on external influences. It is correspondingly expedient to ascertain these current magnitudes statically. Accordingly, the present invention determines the magnitude of a harmful current whose flow, via the two poles of the memory cell, as seen statistically, causes a resistance change that characterizes a change in the memory state of the memory cell, and/or determines the magnitude of a destructive current whose flow, via the two poles of the memory cell, as seen statistically, causes permanent damage to the memory cell.

The measurement is, for example, effected after a predetermined time after the other of the two poles has been brought to the second potential by connection to the conductor. In this way, it can be ensured that a possible matching of the potential of the conductor to the first potential is effected at least partly, i.e., to a meaningful extent, before the measurement takes place. Accordingly, the measurement result of the measurement can be used for ascertaining a presumable memory state of the memory cell.

When the apparatus and the method according to the invention are used to read from a memory arrangement in which one or more memory cells or even each memory cell has an ion-conducting structure arranged between two electrodes and the electrical properties of which are changed by applying a voltage to the two electrodes, each of the electrodes is electrically connected to a respective pole of the respective memory cell. Such a structure is characteristic of CB cells. The apparatus and method according to the invention are used, for example, to read from a memory arrangement in which one or more memory cells or even each memory cell is a resistively switching cell, in particular, a conductive bridging cell. Further, the apparatus and method according to the invention are used to read from a memory arrangement in which one or more memory cells or even each memory cell is such that the resistance value of the memory cell that reflects a memory state can be changed by applying a voltage to the two poles of the memory cell.

The apparatus and method according to the invention are used, for example, in conjunction with a memory arrangement including a respective multiplicity of bit, word, and plate lines. The memory cells are arranged in an array-like fashion. Each of the two poles of the memory cells are connected to a respective bit or plate line to enable the memory cells to be individually written to or read from. For example, one of the two poles of the memory cells is connected to the respective bit or plate line via a transistor, called a selection transistor, which can be controlled by a respective word line.

In memory arrangements of this type, the plate lines supply current, while the bit and word lines select the cell to be read or written to. The selection is effected by enabling or preventing a current flow via the cell by the assigned selection transistor being switched on or off in response to the voltage state of the corresponding word line. The magnitude of the current flow is determined by the voltage ratio of the respective bit line to the respective plate line. The series circuit of the cell with a selection transistor, in particular, prevents undesirable leakage currents via the cell outside intentional read and write operations.

A connection is produced between the conductor and a measuring device, which is released directly prior to the measurement. In particular, the measuring device measures the potential of the conductor in order to determine, for example, as described above, whether the memory cell is in a high-resistance state or a low-resistance state. A (direct or indirect) connection between the conductor and the measuring device is particularly expedient in this respect. By releasing or interrupting the connection between the conductor and the measuring device, however, it is possible to prevent the potential of the conductor from being influenced. This contributes to the fact that no voltage which may suffice, for example, to bring about an undesirable change in the memory state of the memory cell is applied to the corresponding poles of the memory cell.

BRIEF DESCRIPTION OF THE FIGURES

The invention is explained in more detail below in exemplary embodiments with reference to the drawings without the respective fundamental concept of the invention thereby being intended to be restricted in any way, since numerous configuration variants are made available to the person skilled in the art on account of the teaching imparted by the invention, without departing from the scope of the invention. In the figures:

FIG. 13 illustrates further simulated signal profiles of a read operation with boost operation in accordance with an exemplary embodiment of the invention.

DETAILED DESCRIPTION

Figure 1A:
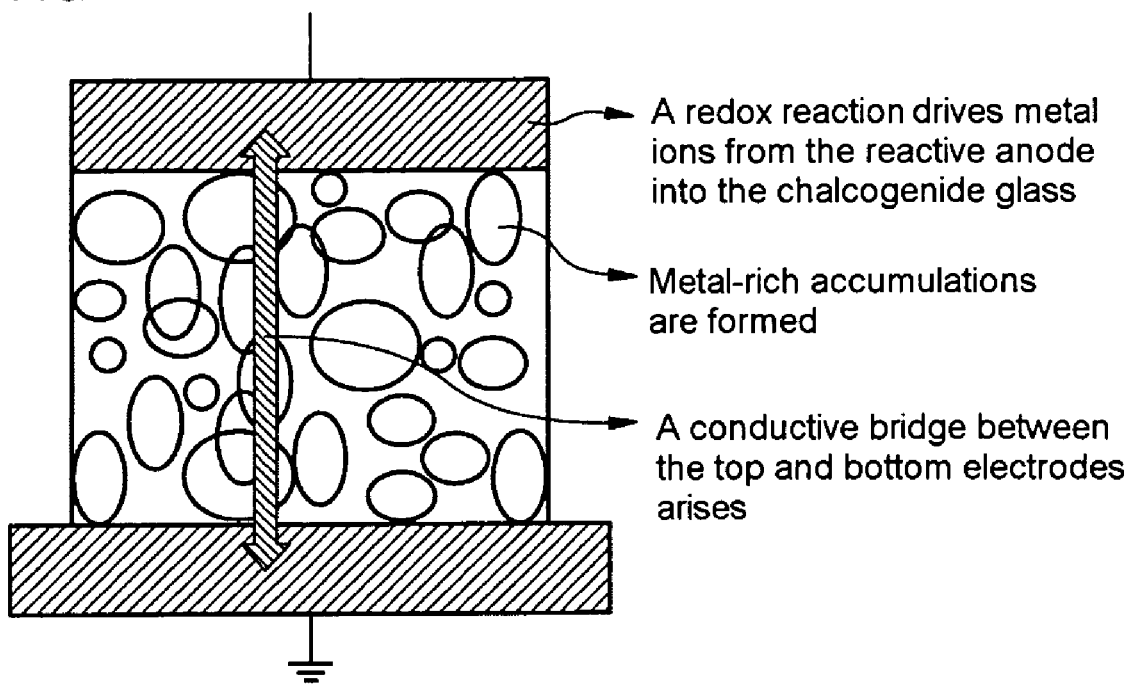
FIG. 1A is a schematic illustration of the construction and the functioning of a CB contact.
Figure 1B:
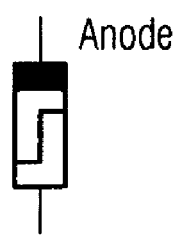
FIG. 1B illustrates the circuit symbol of a CB cell.

FIG. 1A schematically illustrates the construction and the functioning of a CB contact, i.e., a CB cell, used as a memory element for the reading method of the present invention. Situated between a bottom inert cathode (e.g., made of tungsten) and a top active anode (e.g., silver) is an insulating chalcogenide glass (e.g., GeSe) into which readily mobile metal ions (e.g., silver) have been indiffused (e.g., by photodiffusion). Conductive regions having a high metal concentration thereby form in the chalcogenide glass. The regions are electrically insulated from one another in the carrier material. In the event of writing, application of a positive voltage to the anode generates further metal ions, which produce a conductive path between the electrodes. In the event of erasure, the path is cleared away by applying a negative voltage, and the electrodes are insulated from one another again. The resistance change is many orders of magnitude in this case. The polarity of the CB contact is critical in the use in electrical circuits. FIG. 1B illustrates the circuit symbol of a CB cell; the anode side is identified by a thick bar.

Figure 2A:
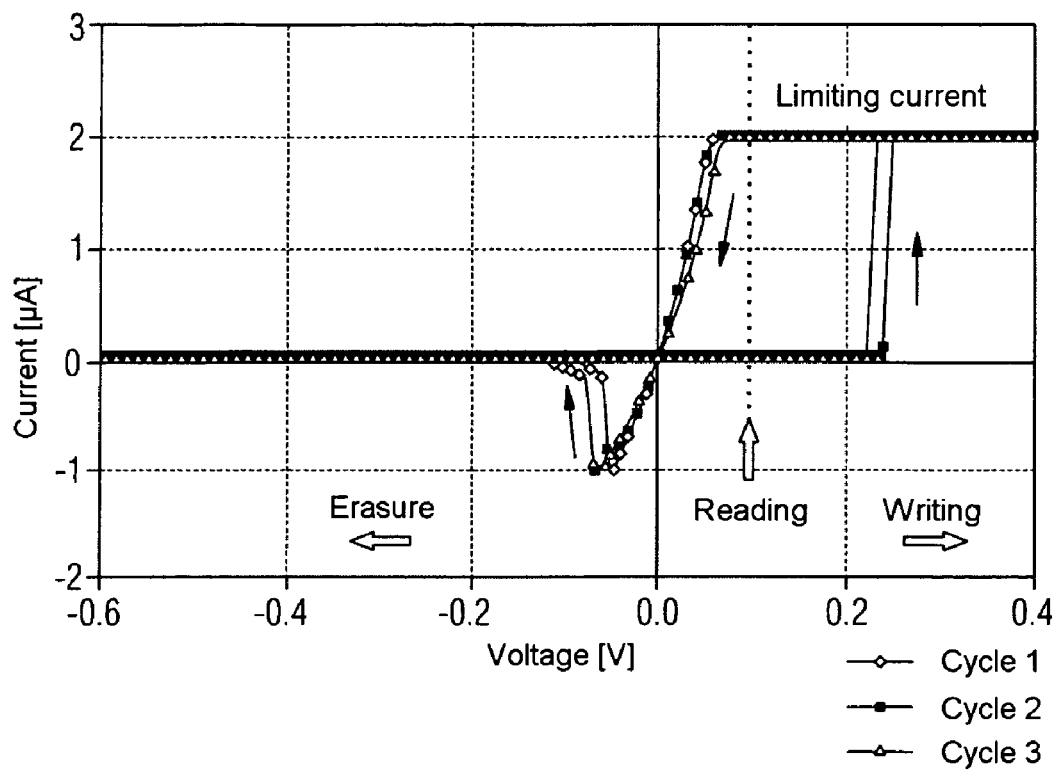
FIG. 2A is a graph showing ascertained I-U characteristic curves of a CB cell.
Figure 2B:
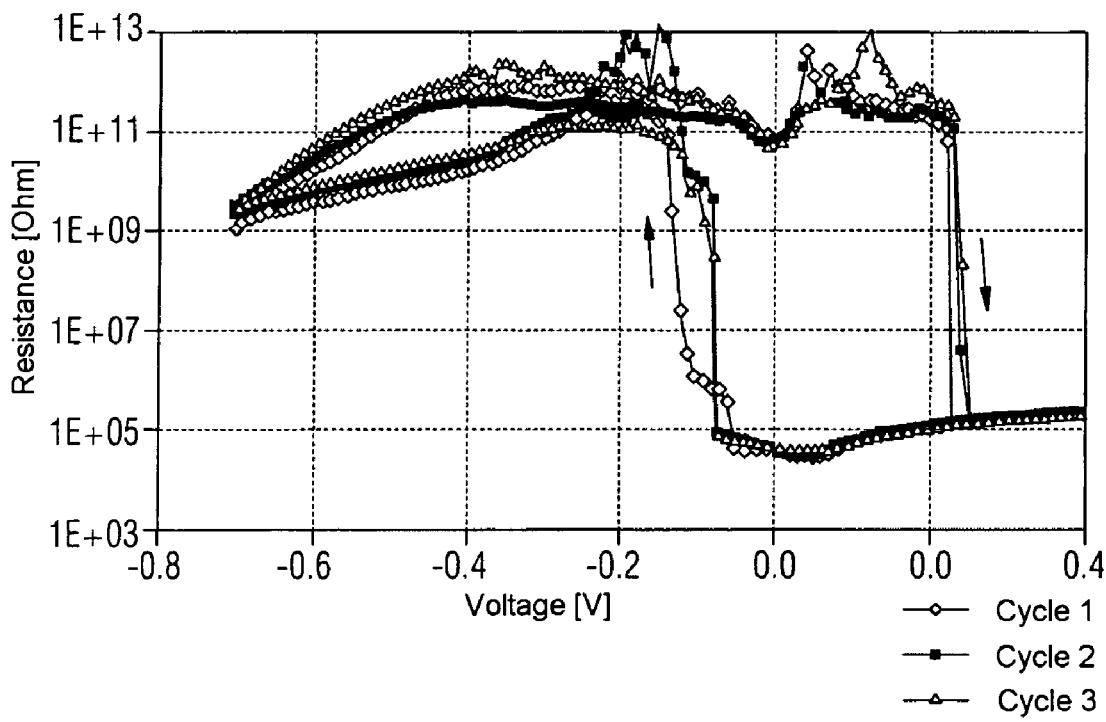
FIG. 2B is a graph showing ascertained R-U characteristic curves of a CB cell.

FIG. 2A illustrates ascertained I-U characteristic curves of a CB cell with +220 mV ON and −60 mV OFF threshold voltage, i.e., a typical switching characteristic of a CB contact. FIG. 2B illustrates ascertained R-U characteristic curves of a CB cell analogously to FIG. 2A. In the initial state, the cell is at a very high resistance (OFF resistance in the region of $10^{10}$ or more Ω). Upon applying a positive voltage, the resistance initially does not change, until it decreases abruptly at a threshold voltage (writing threshold voltage), for example, at approximately 220 mV in the example shown. By limiting the current to a compatible value (limiting current), it is possible to prevent the cell from being destroyed by an excessively high current flow. This procedure is referred to as "current compliance". A corresponding resistance value is established depending on the level of the write current. In the typical characteristic curve shown, the ON resistance is approximately $10^4 \ldots 10^5$ Ω. Upon applying a negative voltage, the cell switches back to the high-resistance state at a threshold voltage (erasure threshold voltage), for example, at approximately −50 mV in the example shown, and the current flow ceases again. A certain level and duration of the applied erasure voltage pulse after the changeover to the high-resistance state is necessary in order to obtain defined initial conditions for a subsequent write operation. The cell is read, for example, at a voltage value lying below the writing threshold voltage. Even when interference voltages occur, the writing and erasure threshold voltage should not be exceeded or undershot, particularly during reading, in order to avoid undesirable reprogramming of the cell. Given a writing threshold voltage of 220 mV as in the case shown, it is possible, e.g., to choose a read voltage in the range of 100-150 mV.

Figure 3:
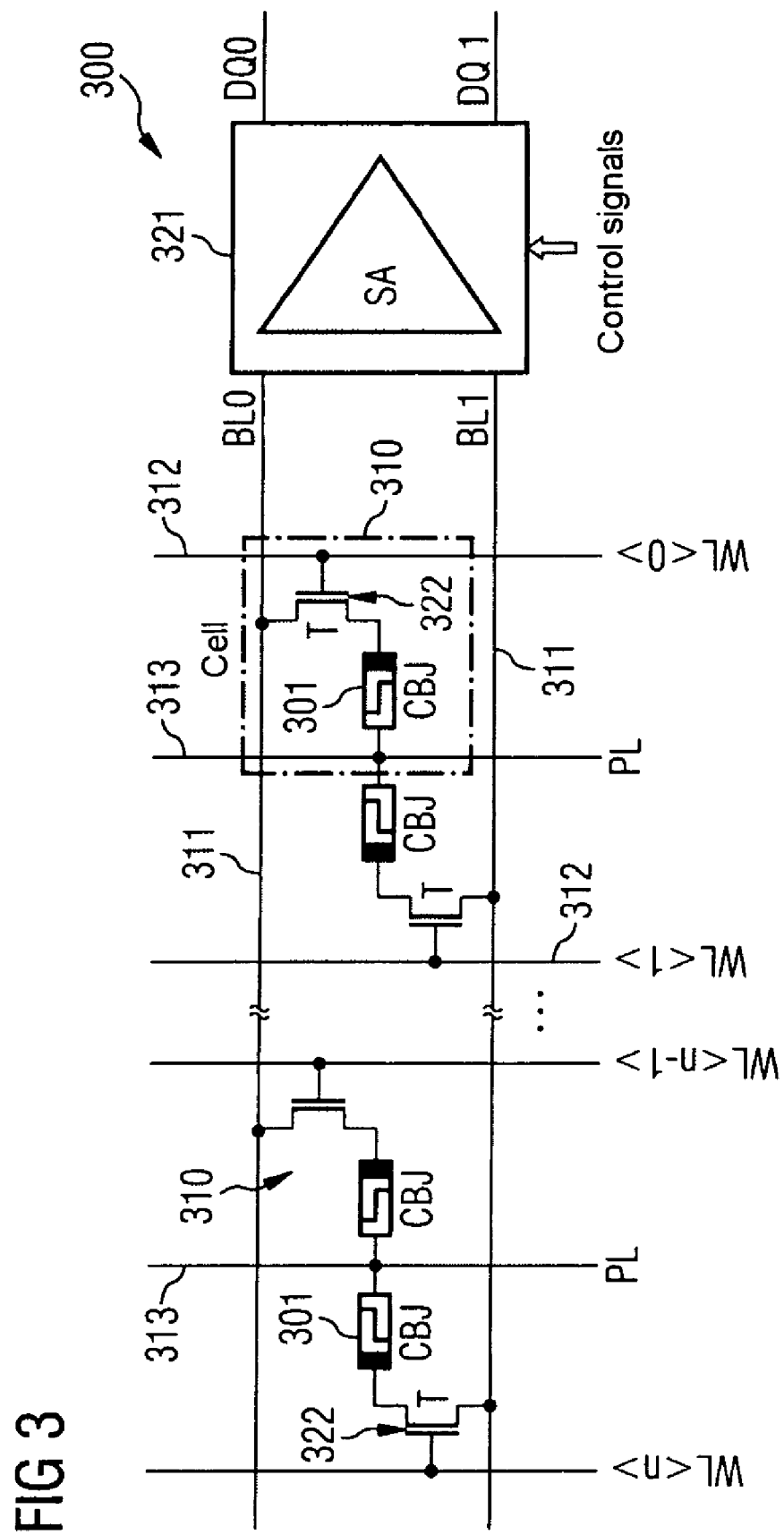
FIG. 3 illustrates an arrangement for reading from a memory arrangement in accordance with an exemplary embodiment of the invention.

FIG. 3 shows an arrangement for reading from a memory arrangement 300 that includes a multiplicity of memory cells 310. In particular, FIG. 3 shows a bit-line-based CBRAM architecture for voltage-based reading from the memory cells (CBRAM voltage read bit line architecture). Each memory cell 310 includes a CB cell 301 and a selection transistor 322 connected in series with one pole of the CB cell 301. Each series circuit forms a memory cell 310 that includes CB cell 301 and selection transistor 322 and is connected between a respective bit line 311 and a respective plate line 313. The gate terminal of the respective selection transistor 322 controls the conduction state of the selection transistor 322 and is connected to a respective word line 312. In the exemplary embodiment shown, one pole of the selection transistor 322 is connected to a respective bit line 311 and one pole of the CB cell 301 is connected to a respective plate line 313. It is also possible for one pole of the selection transistor 322 to be connected to a respective plate line 313 and one pole of the CB cell 301 to be connected to a respective bit line 311.

Two bit lines 311 are connected to the inputs of a respective differential sense amplifier 321, which supplies corresponding output signals DQ0, DQ1. Operation of the sense amplifier 321 is controlled by corresponding control signals.

As already described above, a memory array may be constructed from a multiplicity of such bit line pairs. In this case, the selection transistors 322 are connected in columnwise fashion, for example, to common word lines 312.

Figure 4A:
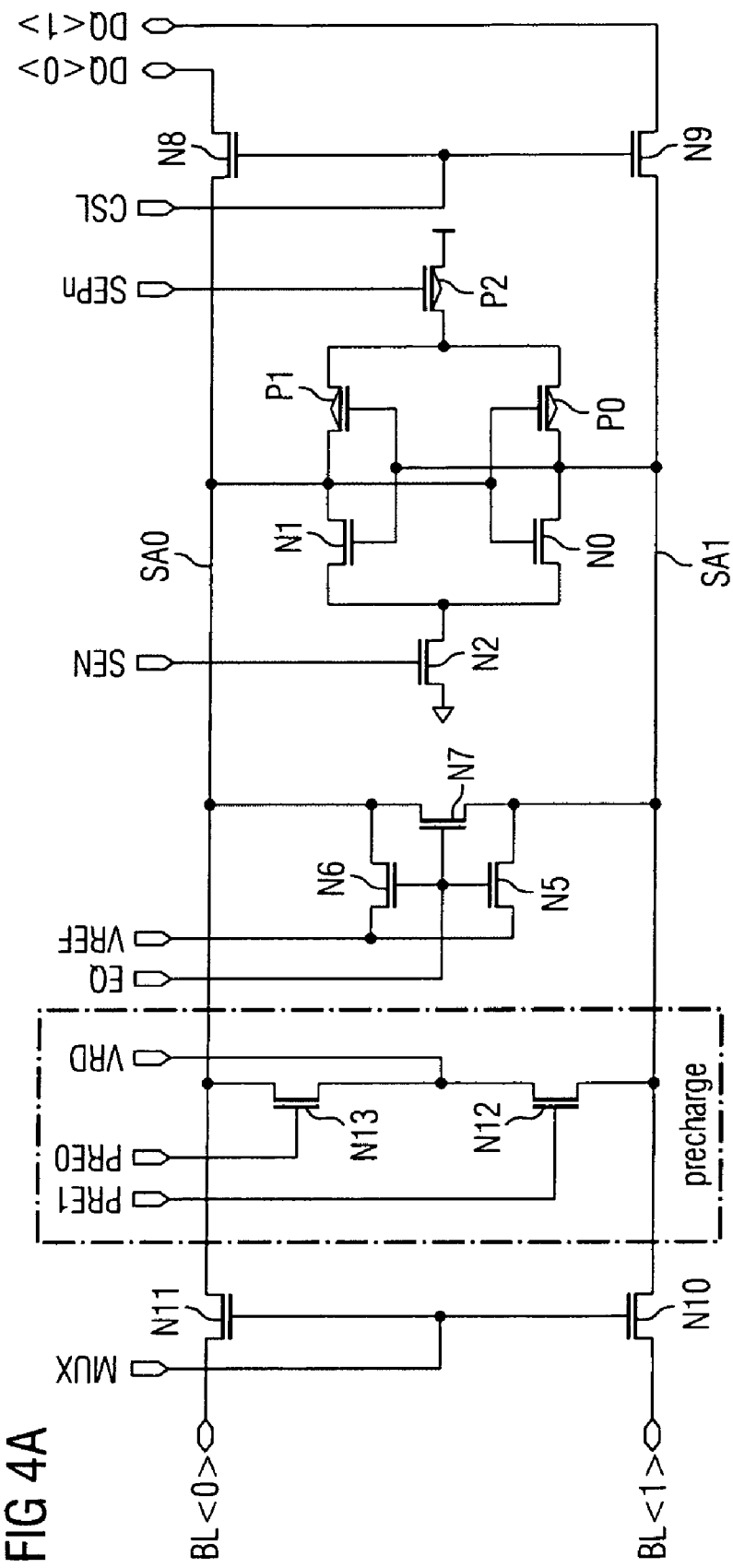
FIG. 4A illustrates an arrangement of a sense amplifier with a precharge circuit in accordance with an exemplary embodiment of the invention.
Figure 4B:
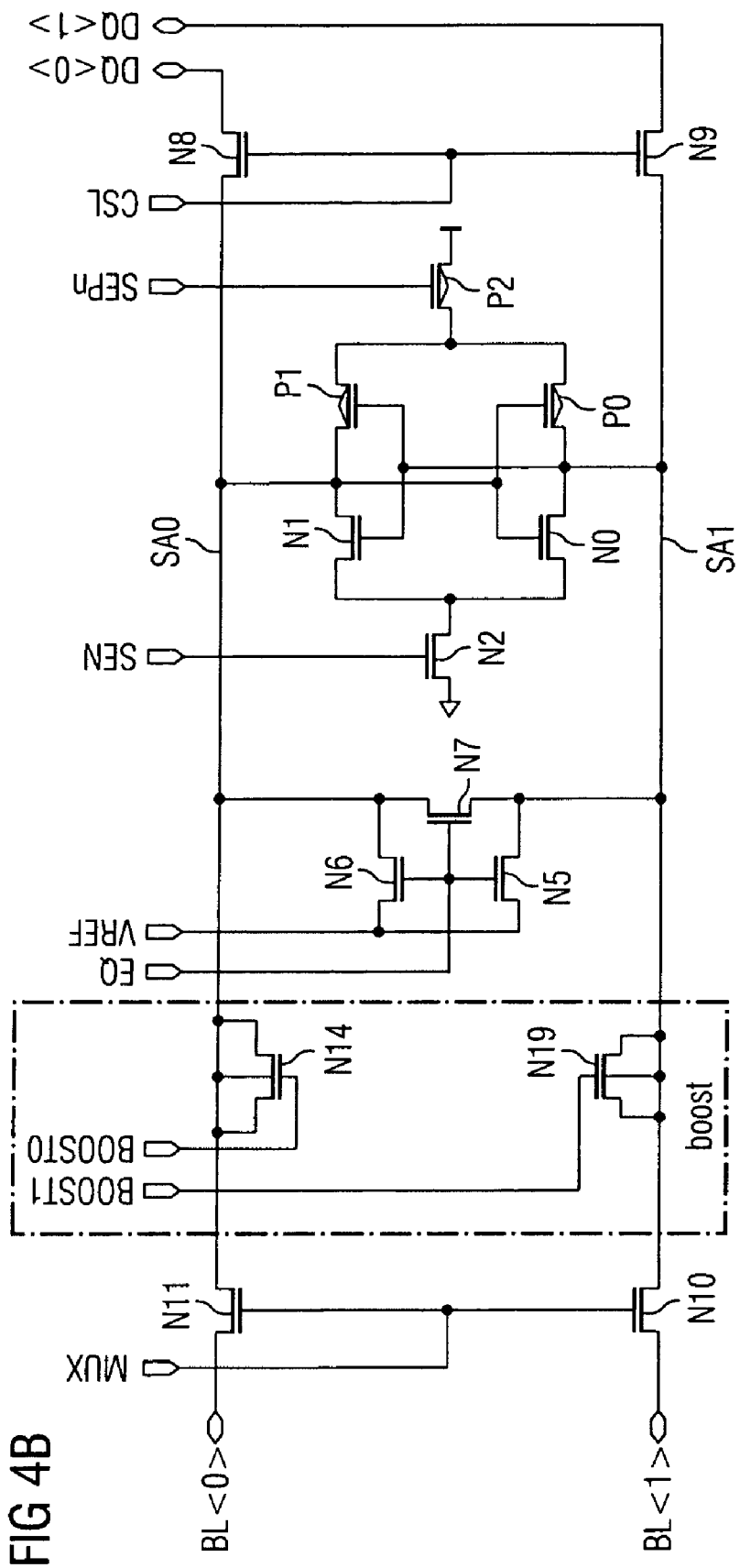
FIG. 4B illustrates a arrangement of a sense amplifier with a boost circuit in accordance with an exemplary embodiment of the invention.

FIG. 4A shows a possible arrangement of a sense amplifier with a precharge circuit framed by broken lines, while FIG. 4B illustrates the arrangement of a similarly configured sense amplifier with a boost circuit likewise framed by broken lines. In particular, FIGS. 4A and 4B show a sense amplifier circuit for voltage read. The actual amplifier includes two negative feedback inverters, is constructed from the transistors N0, N1, N2, P0, P1, P2, and is controlled by the signals SEN and SEPn. Under the control of the signal EQ, the bit lines BL<0>, BL<1> can be charged to the reference voltage VREF by an equalizer circuit including the transistors N5, N6, N7. Under control of the signal CSL, a connection to a data bus DQ<0>, DQ<1> can be produced via the transistors N8, N9. Under control of the signal MUX, the sense amplifier can be isolated from the bit lines BL<0>, BL<1> by the transistors N10, N11. The two alternative charging circuits for the bit line are shown in the frames depicted by broken lines. Because the precharge circuit has transistors N12, N13 (shown in FIG. 4A), a bit line BL<0>, BL<1> can be charged to the read voltage VRD by a precharge signal PRE0 and PRE1, respectively. As an alternative, a bit line BL<0>, BL<1> can be brought to a specific voltage value by the boost circuit shown in FIG. 4B, by pulsing of the signal BOOST0 and BOOST1, respectively. The two transistors N14, N19 are connected capacitances for this purpose. Other embodiments of the capacitors, the actual amplifier, the equalizer circuit, etc. can also be employed according to the invention as a person skilled in the art will readily be able to derive or recognize such alternative embodiments from his expert knowledge and the relevant specialist literature on the basis of the above explanations.

Figure 5:
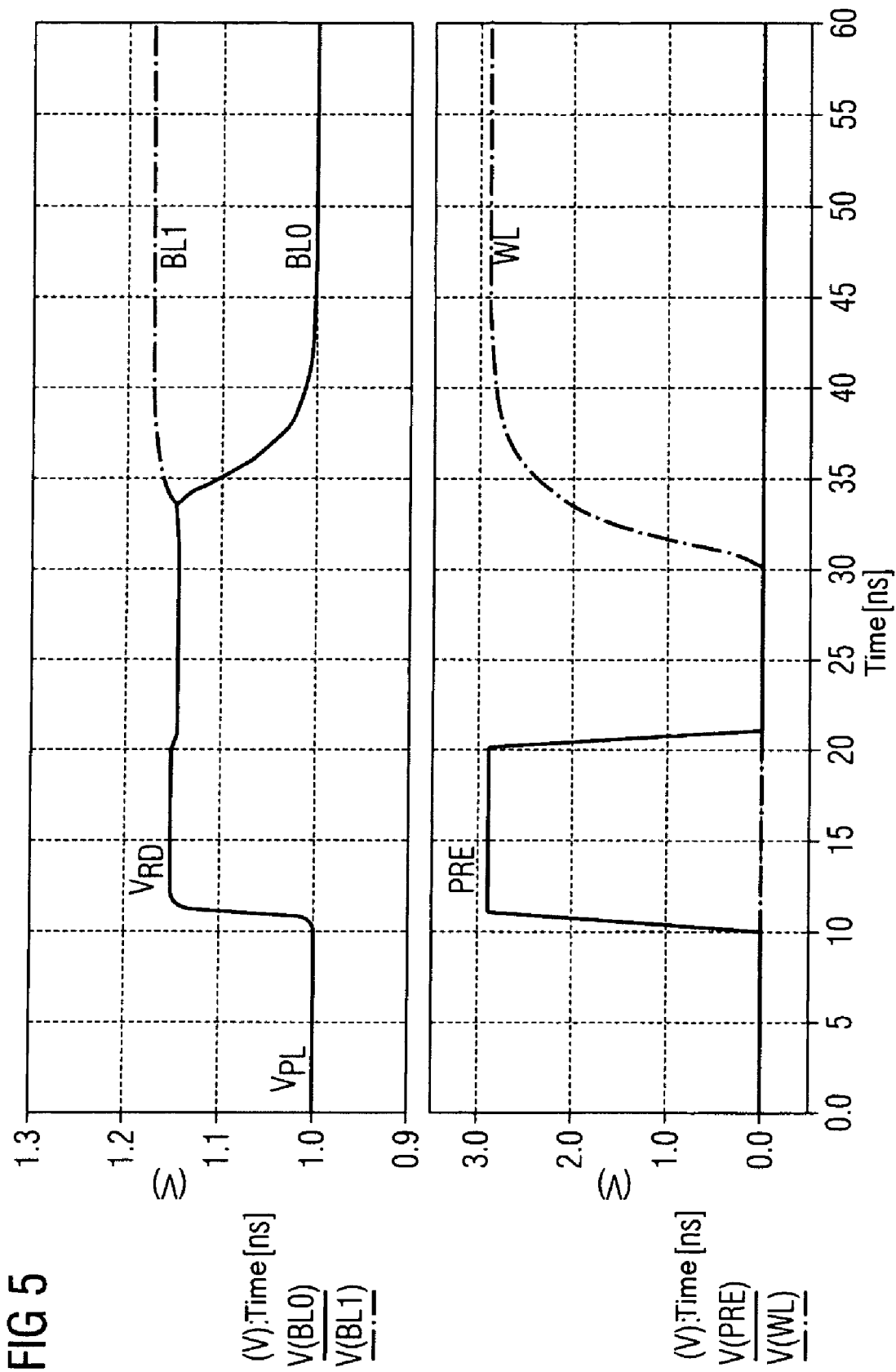
FIG. 5 is a schematic illustration of the charging of a bit line and its subsequent discharging in accordance with an exemplary embodiment of the invention.

FIG. 5 schematically shows how a bit line might be charged and subsequently discharged after the opening of a selection transistor (signal WL, word line), for example, by the circuits of FIGS. 3 and 4A. In particular, FIG. 5 shows bit line precharge read signals. In this case, the top half of FIG. 5 illustrates the voltage profile of a respective bit line, while the bottom half of FIG. 5 illustrates the signal profile PRE of one of the terminals PRE0, PRE1 of FIG. 4 and the signal profile WL of a corresponding word line 312 of FIG. 3.

First, the voltage of the bit line (top half of the figure) is brought to a read voltage $V_{RD}$, for example, by a precharge circuit controlled by the PRE signal. Afterward, the bit line rapidly discharges to the voltage potential $V_{PL}$ of the plate line in the case of a low cell resistance (case BL0). In the case of a very high cell resistance (case BL1), the voltage on the bit line practically does not change.

Figure 6:
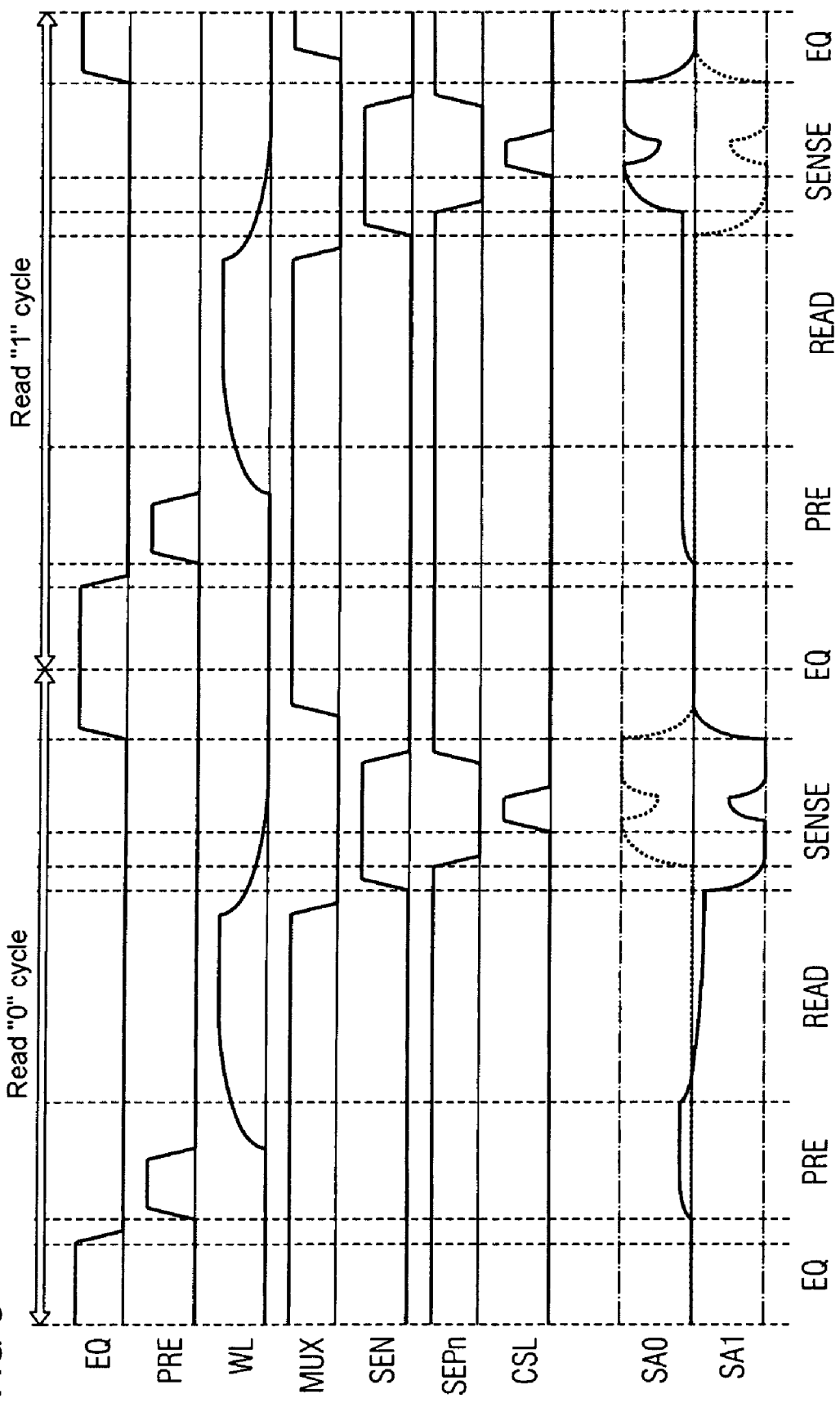
FIG. 6 is a schematic illustration of the control signals and the corresponding bit line signals or the signals in the sense amplifier for reading a "0" or a "1" by a precharge operation in accordance with an exemplary embodiment of the invention.

FIG. 6 illustrates the control signals and the corresponding bit line signals or signals in the sense amplifier for reading a "0" or a "1" schematically and with exemplary reference to the exemplary embodiments of FIGS. 3 and 4A (precharge circuit). In particular, FIG. 6 shows a signal scheme of a voltage-based CBRAM read operation by a precharge operation (CBRAM voltage read signal scheme with bit line precharge).

Prior to the actual read access, the bit lines are charged to the reference voltage and equalized (signal EQ, phase EQ). The bit line to which the cell to be read is connected (BL0, SA0) is charged to the read voltage $V_{RD}$ (signal PRE, phase PRE). With the opening of the word line (WL), the bit line is discharged to the plate voltage $V_{PL}$ via the cell resistance (phase READ). The bit lines are decoupled from the sense amplifier (signal MUX) and the sense amplifier is activated (signals SEN, SEPn, phase SENSE). Due to the small cell resistance, the voltage on the bit line (SA0) falls to a value below the reference voltage (SA1) and is assessed as "0". As soon as the voltage level has been amplified sufficiently, the connection to the local data bus can be produced (DQ<0>, DQ<1>, signal CSL) in order to forward the data read to corresponding outputs of the memory circuit. The connection to the data bus generates a momentary drop in the amplified signal level, which is soon compensated for by the amplifier. After deactivation of the sense amplifier, the bit lines are connected (MUX) to the sense amplifier again and charged (EQ) to the reference voltage in preparation for the next read operation.

The read access of a "1" value illustrated proceeds analogously but with the difference that the voltage on the bit line (SA) does not fall due to a very high cell resistance after the opening of the word line. The voltage on the bit line (SA0) therefore remains above the reference voltage (SA1) and is assessed as "1".

Figure 7:
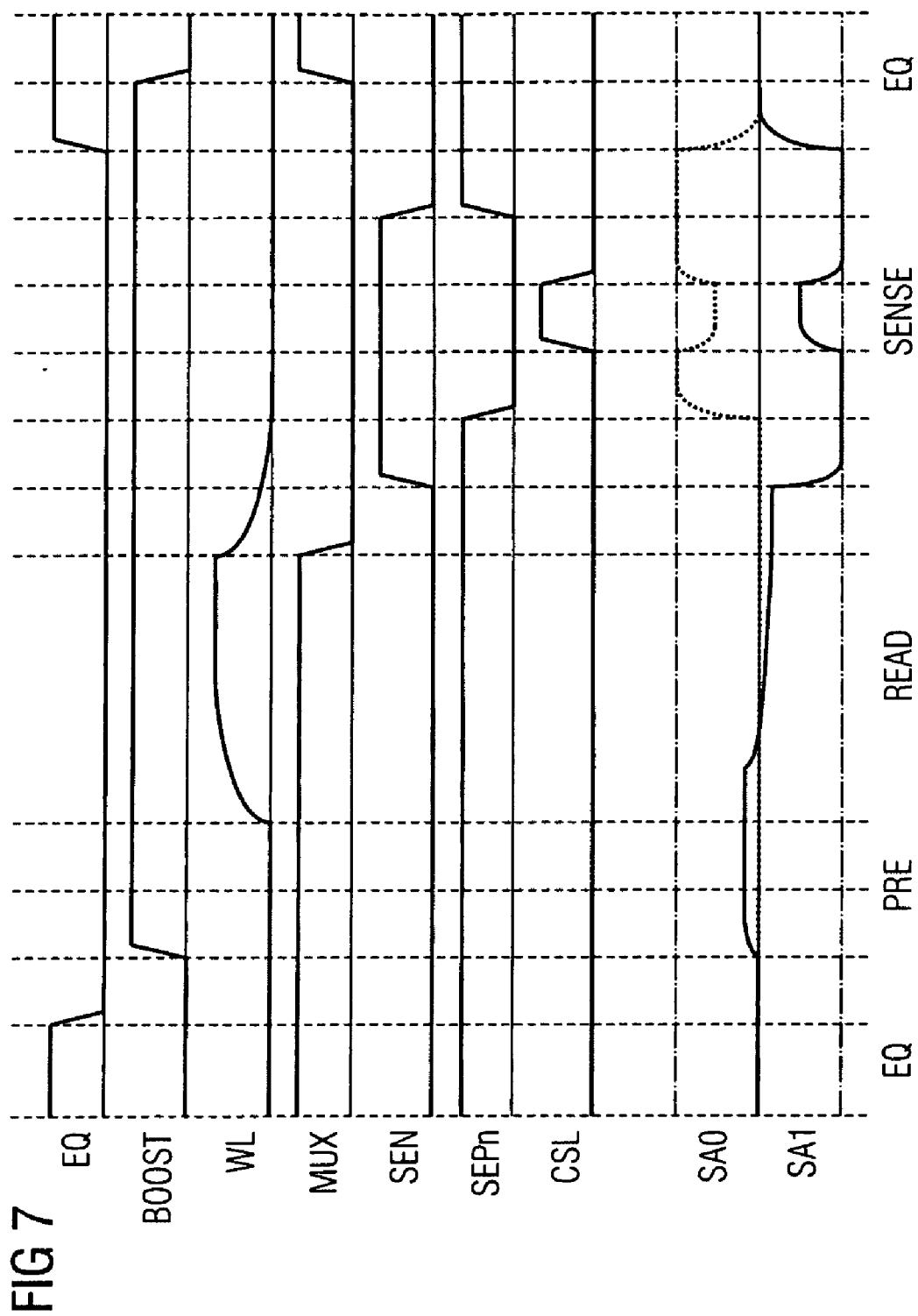
FIG. 7 is a schematic illustration of the control signals and the corresponding bit line signals or the signals in the sense amplifier for reading a "0" by a boost operation in accordance with an exemplary embodiment of the invention.

FIG. 7 illustrates the control signals and the corresponding bit line signals or signals in the sense amplifier for reading a "0" schematically and with exemplary reference to the exemplary embodiments of FIGS. 3 and 4B (boost circuit). In particular, FIG. 7 shows a signal scheme of a voltage-based CBRAM read operation by a bit line boost operation (CBRAM voltage read signal scheme with bit line boost).

The sequence shown in FIG. 7 is relatively identical to the sequence described with respect to FIG. 6 and needs no further explanation in this regard. What is different, however, is that the bit line is charged to the read voltage by the signal BOOST, which is coupled, for example, capacitively onto the respective bit line (BL0).

Figure 8:
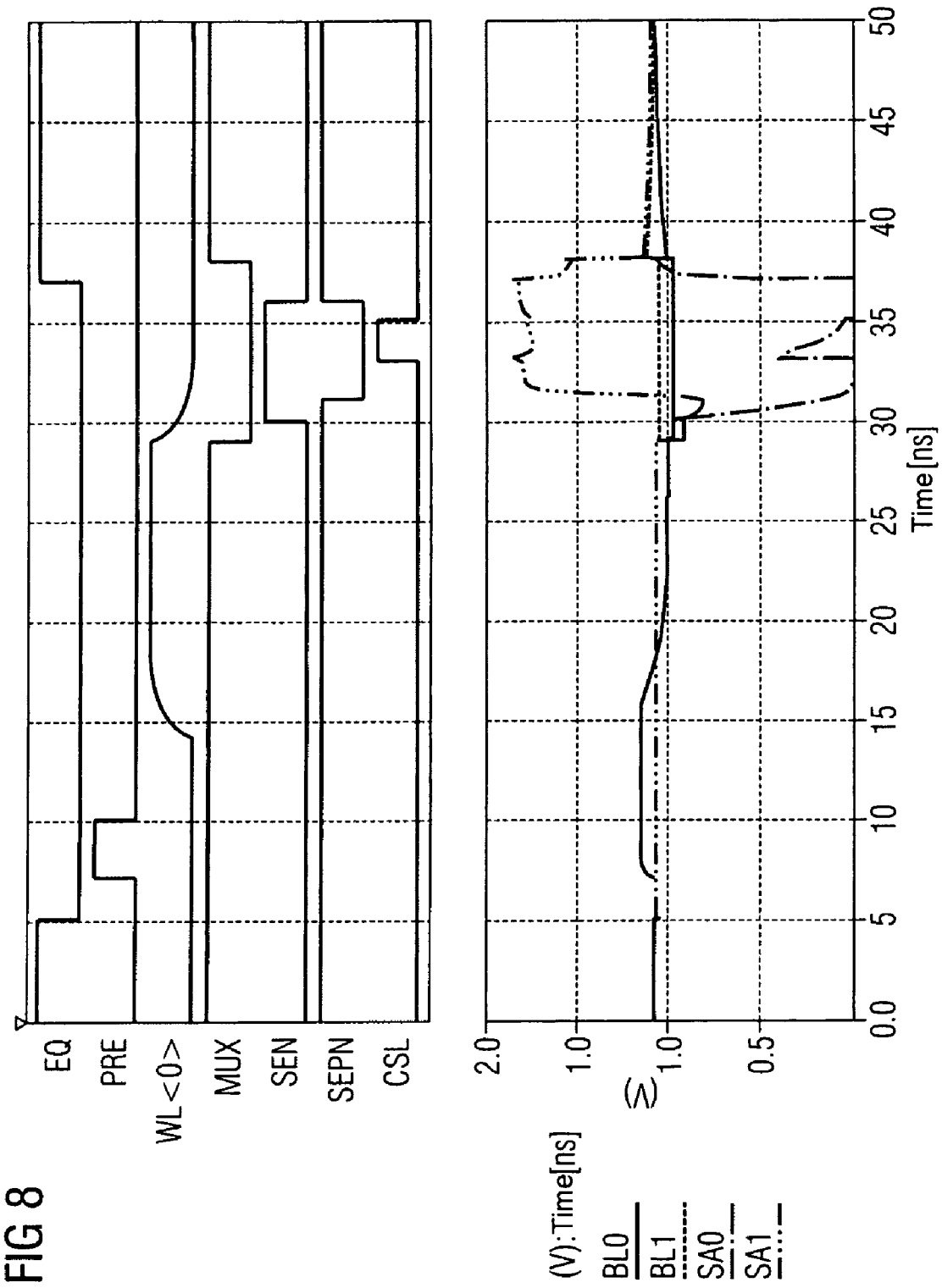
FIG. 8 illustrates simulated signal profiles of a read operation with precharge operation in accordance with an exemplary embodiment of the invention.
Figure 9:
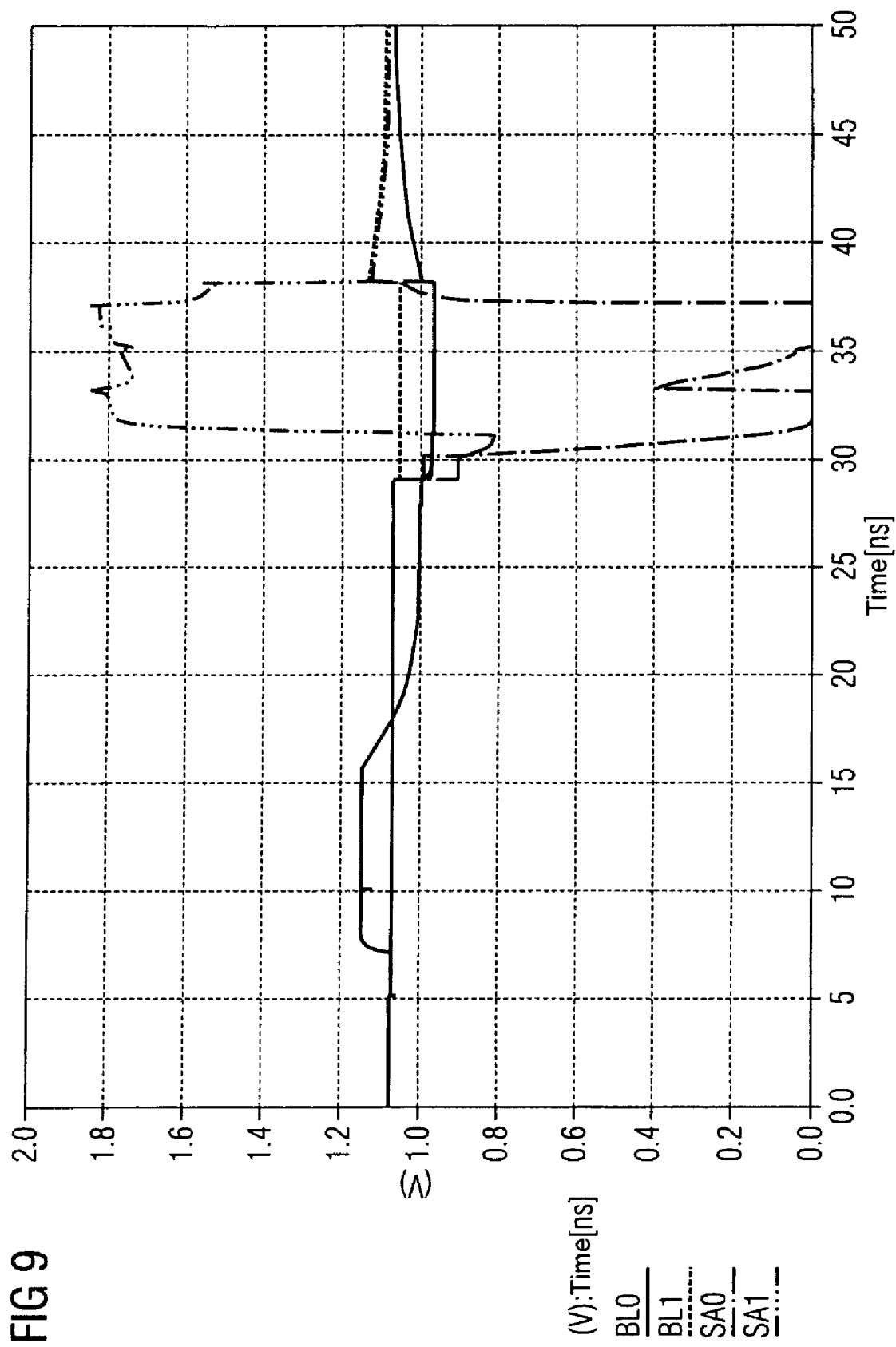
FIG. 9 illustrates further simulated signal profiles of a read operation with precharge operation in accordance with an exemplary embodiment of the invention.
Figure 10:
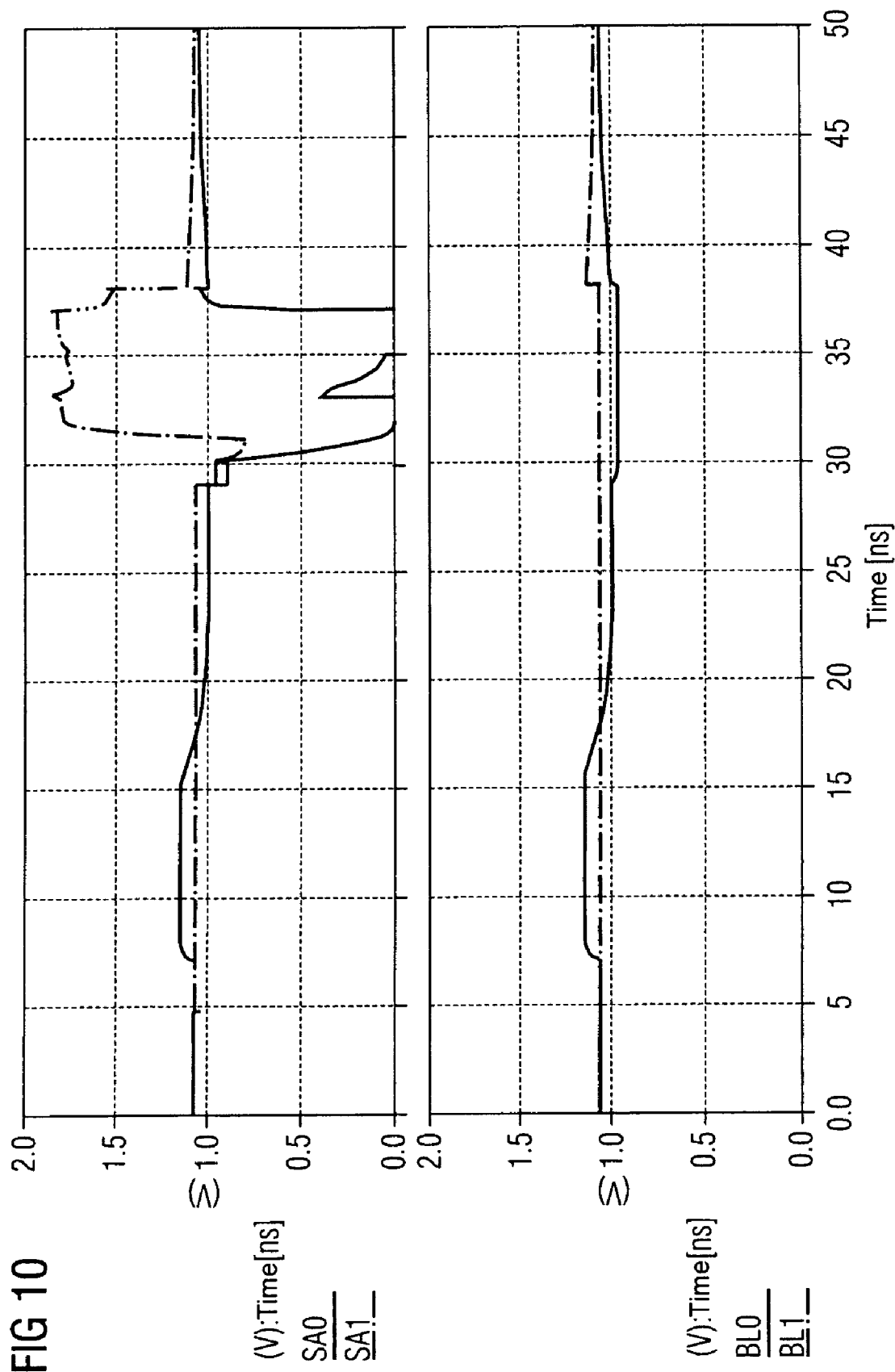
FIG. 10 illustrates further simulated signal profiles of a read operation with precharge operation in accordance with an exemplary embodiment of the invention.

FIGS. 8-10 illustrate simulated signal profiles of a read operation in accordance with an exemplary embodiment of the invention in which a respective bit line is charged beforehand, i.e., is subject to a precharge operation. In particular, FIGS. 8-10 show simulated signal profiles for a precharge scheme as described above (the signal designations introduced above are applicable). Accordingly, FIGS. 8-10 each show a CBRAM voltage read cycle simulation in accordance with a bit line precharge scheme with relaxed timing, i.e., with a timing that does not exhaust the limits of the circuit with regard to its operating frequency.

FIG. 10 especially reveals how the voltage swing on the bit line is kept small by decoupling the bit lines (BL0, BL1) from the sense amplifier circuit (SA0, SA1). As a result, the voltage across the CB cell remains below the writing threshold voltage and undesirable programming is thus avoided.

Figure 11:
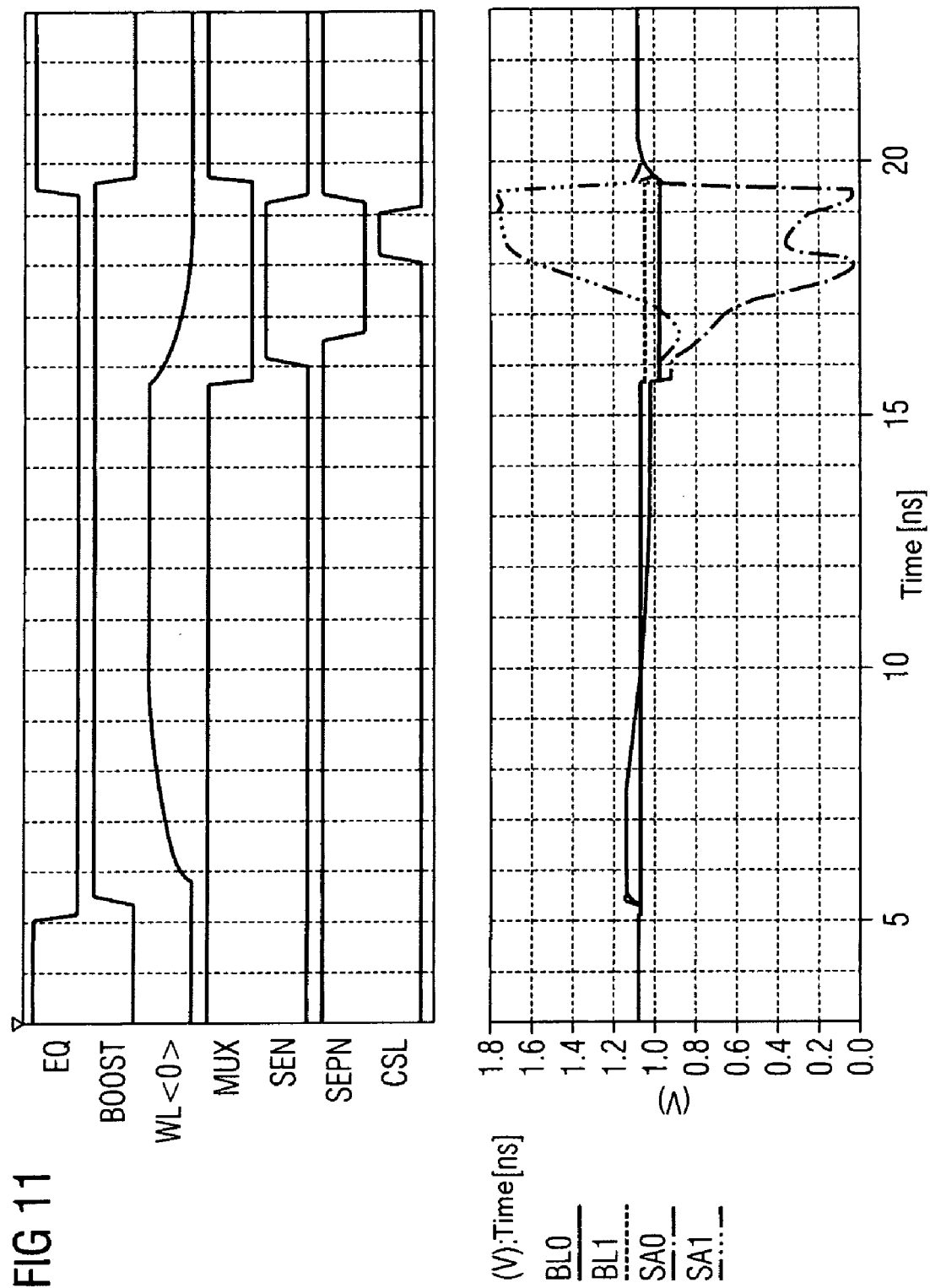
FIG. 11 illustrates simulated signal profiles of a read operation with boost operation in accordance with an exemplary embodiment of the invention.
Figure 12:
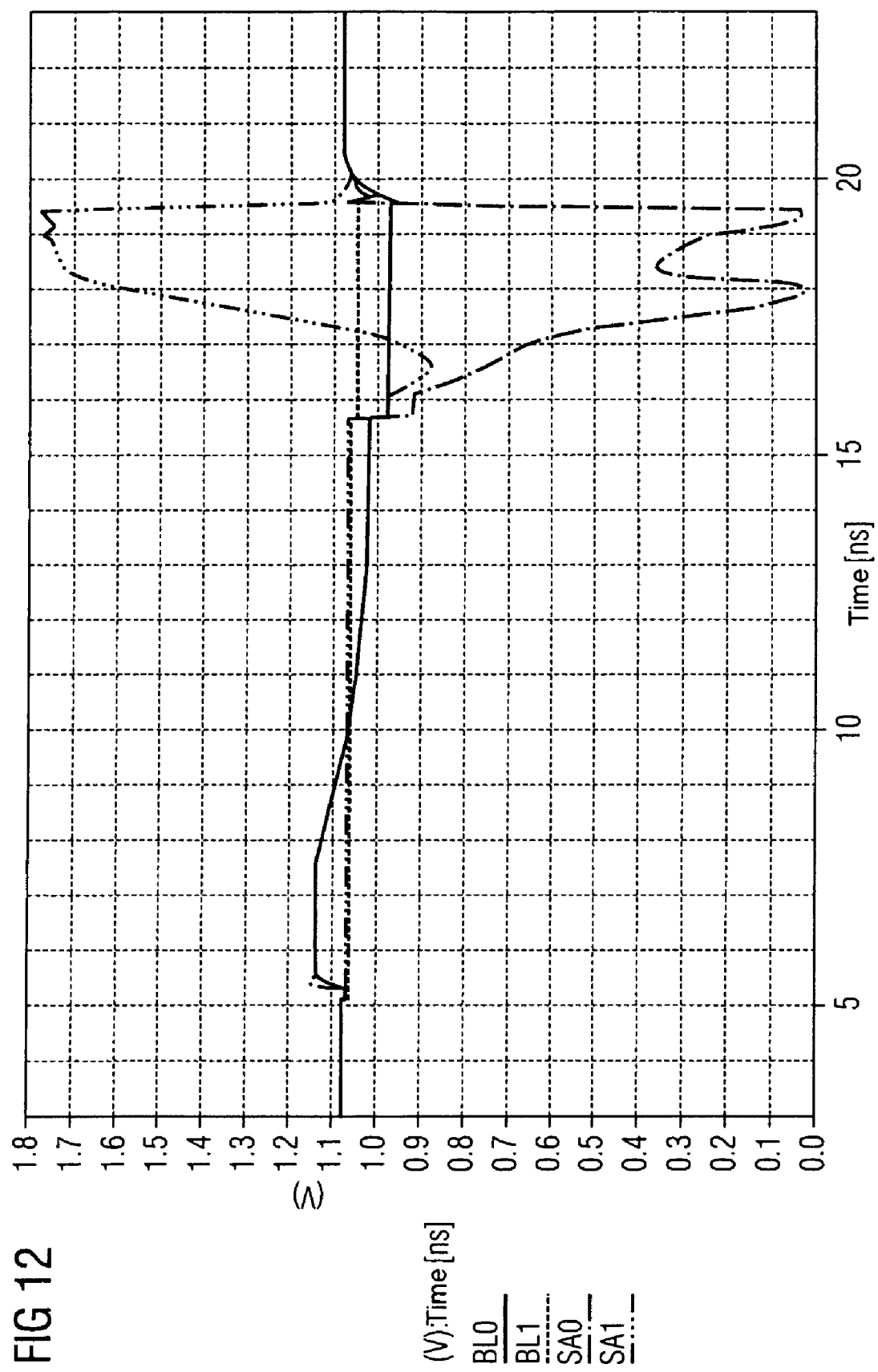
FIG. 12 illustrates further simulated signal profiles of a read operation with boost operation in accordance with an exemplary embodiment of the invention.

FIGS. 11-13 illustrate, analogously to FIGS. 8-10, simulated signal profiles of a read operation with boost operation in accordance with an exemplary embodiment of the invention. In particular, FIGS. 11-13 illustrate simulated signal profiles for a boost scheme as described above (the signal designations introduced above are applicable). Accordingly, FIGS. 11-13 in each case show a CBRAM voltage read cycle simulation in accordance with a bit line boost scheme. The simulations of FIGS. 11-13 also show that cycle times of the order of magnitude of 25 ns can be achieved with such a read method.

According to the present invention, a bit line is charged to a voltage value, the bit line is discharged via a cell resistance, and subsequently a resulting voltage difference is assessed in a differential sense amplifier.

In an arrangement proposed, the bit line on which a cell to be read is arranged is charged to a voltage that is higher (or lower) than the voltage on the respective plate line by the read voltage. As a result of a corresponding selection transistor being switched on, the bit line is discharged (or charged) to the voltage value of the plate line. The description primarily deals only with the first case, in which the bit line voltage lies above the plate line voltage. The circuit arrangement can also be used analogously, as described, for the second case. The RC time constant of cell resistance and bit line capacitance determines the voltage change on the bit line. For a small resistance, the voltage will be relatively rapidly matched to the value of the plate line; for a very high resistance, the voltage on the bit line will remain relatively unchanged. The second input of a differential sense amplifier is held at a voltage level between the values of the precharged bit line and the plate line. Depending on the resistance value of the cell, a positive or negative voltage difference results between the bit line and this reference. The voltage difference is raised to full logic levels in the sense amplifier. In this case, the bit line can be precharged in various ways, e.g., by connection to a suitable voltage source (precharge) or by a voltage pulse being coupled capacitively (boost).

Although embodiments of the invention have been disclosed and described in detail in this description, it is clear to the person skilled in the art that various changes can be made with regard to the configuration, the mode of functioning and the form of the invention without departing from the inventive concept and the scope of the protection thereof. In particular, it is pointed out that the respective features of the invention, including those which are only disclosed in combination with other features of the invention, can be combined in any desired configuration, apart from those which the person skilled in the art recognizes as obviously nonsensical. Moreover, the use of the singular or plural merely indicates a preference and is not to be interpreted as a restriction. Apart from the cases where the contrary is explicitly noted, the plural may be replaced by the singular, and vice versa.

Furthermore, it shall be explicitly pointed out that some features of the invention, for reasons of clarity and conciseness, have only been described in detail with regard to the method according to the invention or the apparatus according to the invention. This in no way involves a restriction of the respective disclosure content or of the respective scope of protection to the method according to the invention or to the apparatus according to the invention. Instead, all explanations relating to the method according to the invention apply mutatis mutandis to the apparatus according to the invention, and vice versa.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

LIST OF REFERENCE SYMBOLS

300 Memory arrangement
301 CB cell
310 Memory cell
311 Bit line
312 Word line
313 Plate line
321 Sense amplifier
322 Selection transistor

What is claimed is:

1. A method for reading from a memory arrangement including at least one memory cell in which a resistance value between two poles of the memory cell reflects a memory state of the memory cell, the method comprising:
   connecting one of the two poles to a charge source with a first potential;
   connecting the other of the two poles to a conductor having a second potential, which lies below the potential of the charge source; and
   measuring the potential of the conductor, further comprising:
   determining a positive threshold voltage that when applied to the two poles of the memory cell, as seen statistically, causes a resistance change that characterizes a change in the memory state of the memory cell; and
   determining a negative threshold voltage that when applied to the two poles of the memory cell, as seen statistically, causes a resistance change that characterizes a change in the memory state of the memory cell,
   wherein the first and second potentials are selected such that the magnitude of their difference does not exceed the sum formed from the magnitude of the positive threshold voltage and the magnitude of the negative threshold voltage.

2. The method as claimed in claim 1, wherein the first and second potentials are selected such that the magnitude of their difference is less than ⅔ and greater than ⅓.

3. The method as claimed in claim 1, wherein the first and second potentials are selected such that the magnitude of their difference is equal to ½ of the sum formed from the magnitude of the positive threshold voltage and the magnitude of the negative threshold voltage.

4. A method for reading from a memory arrangement including at least one memory cell in which a resistance value between two poles of the memory cell reflects a memory cell, the method comprising:
   connecting one of the two poles to a charge source with a first potential;
   connecting the other of the two poles to a conductor having a second potential, which lies below the potential of the charge source; and
   measuring the potential of the conductor, wherein the potential of the conductor is measured by a two-pole differential amplifier, one pole of the two-pole differential amplifier being connected to the conductor and the other pole of the two-pole differential amplifier being held at a third potential between the first and second potentials.

5. A method for reading from a memory arrangement including at least one memory cell in which a resistance value between two poles of the memory cell relfects a memory state of the memory cell, the method comprising:
   connecting one of the two poles to a charge source with a first potential;
   connecting the other of the two poles to conductor having a second potential, which lies below the potential of the charge source; and
   measuring the potential of the conductor, wherein said method further comprises:
   determining the magnitude of a harmful current that when the flow of the harmful current via the two poles of the memory cell, as seen statistically, causes a resistance change that characterizes a change in the memory state of the memory cell,
   wherein the current flow of the current source or sink is restricted to a value less than below the magnitude of the harmful current.

6. A method for reading from a memory arrangement including at least one memory cell in which a resistance value between two poles of the memory cell reflects a memory state of the memory cell, the method comprising:
   connecting one of the two poles to a charge source with a first potential;
   connecting the other of the two poles to a conductor having a second potential, which lies below the potential of the charge source; and
   measuring the potential of the conductor, wherein said method further comprises:
   determining the magnitude of a destructive current that when the flow of the destructive current via the two poles of the memory cell, as seen statistically, causes permanent damage to the memory cell,
   wherein the current flow of the current source or sink is restricted to a value less than the magnitude of the destructive current.

7. A method reading from a memory arrangement including at least one memory cell in which a resistance value between two poles of the memory cell reflects a memory state of the memory cell, the method comprising:
   connecting one of the two poles to a charge source with a first potential;
   connecting the other of the two poles to a conductor having a second potential, which lies below the potential of the charge source; and
   measuring the potential of the conductor, wherein said method further comprises:
   ascertaining a presumable memory state of the memory cell based on a measurement result of the measurement, the measurement being effected after a predetermined time after the other of the two poles has been brought to the second potential by connection to the conductor.

8. A method for reading from a memory arrangement including at least one memory cell in which a resistance value between two poles of the memory cell reflects a memory state of the memory cell, the method comprising:
   connecting one of the two poles to a charge source with a first potential;
   connecting the other of the two poles to a conductor having a second potential, which lies below the potential of the charge source; and
   measuring the potential of the conductor, wherein said method further comprises:
   connecting the conductor to a measuring device; and
   releasing the connection of the conductor to the measuring device directly prior to measuring.

9. A method for reading from a memory arrangement including at least one memory cell in which a resistance value between two poles of the memory cell reflects a memory state of the memory cell, the method comprising:
   connecting one of the two poles to a charge sink with a first potential;
   connecting the other of the two poles to a conductor having a second potential, which lies above the potential of the charge sink; and
   measuring the potential of the conductor, wherein said method further comprises;
   determining a positive threshold voltage that when applied to the two poles of the memory cell, as seen statistically, causes a resistance change that characterizes a change in the memory state of the memory cell; and
   determining a negative threshold voltage that when applied to the two poles of the memory cell, as seen statistically, causes a resistance change that characterizes a change in the memory state of the memory cell,
   wherein the first and second potentials are selected such that the magnitude of their difference does not exceed the sum formed from the magnitude of the positive threshold voltage and the magnitude of the negative threshold voltage.

10. The method as claimed in claim 9, wherein the first and second potentials are selected such that the magnitude of their difference is less than ⅔ and greater than ⅓.

11. The method as claimed in claim 9, wherein the first and second potentials are selected such that the magnitude of their difference is equal to ½ of the sum formed from the magnitude of the positive threshold voltage and the magnitude of the negative threshold voltage.

12. A method for reading from a memory arrangement including at least one memory cell in which a resistance value between two poles of the memory cell reflects a memory state of the memory cell, the method comprising:
   connecting one of the two poles to a charge sink with a first potential;
   connecting the other of the two poles to a conductor having a second potential, which lies above the potential of the charge sink; and
   measuring the potential of the conductor, wherein the potential of the conductor is measured by a two-pole differential amplifier, one pole of the two-pole differential amplifier being connected to the conductor and the other pole of the two-pole differential amplifier being held at a third potential between the first and second potentials.

13. A method for reading from a memory arrangement including at least one memory cell in which a resistance value between two poles of the memory cell reflects a memory state of the memory cell, the method comprising:
   connecting one of the two poles to a charge sink with a first potential;
   connecting the other of the two poles to a conductor having a second potential, which lies above the potential of the charge sink; and
   measuring the potential of the conductor, wherein said method further comprises:
   determining the magnitude of a harmful current that when the flow of the harmful current via the two poles of the memory cell, as seen statistically, causes a resistance change that characterizes a change in the memory state of the memory cell,
   wherein the current flow of the current source or sink is restricted to a value less than below the magnitude of the harmful current.

14. A method for reading from a memory arrangement including least one memory cell in which a resistance value between two poles of the memory cell reflects a memory state of the memory cell, the method comprising:
   connecting one of the two poles to a charge sink with a first potential;
   connecting the other of the two poles to a conductor having a second potential, which lies above the potential of the charge sink; and
   measuring the potential of the conductor, wherein said method further comprises:
   determining the magnitude of a destructive current that when the flow of the destructive current via the two poles of the memory cell, as seen statistically, causes permanent damage to the memory cell,
   wherein the current flow of the current source or sink is restricted to a value less than the magnitude of the destructive current.

15. A method for reading from a memory arrangement including at least one memory cell in which a resistance value between two poles of the memory cell reflects a memory state of the memory cell, the method comprising;
   connecting one of the two poles to a charge sink with a first potential;
   connecting the other of the two poles to a conductor having a second potential, which lies above the potential of the charge sink; and
   measuring the potential of the conductor, wherein said method further comprises:
   ascertaining a presumable memory state of the memory cell based on a measurement result of the measurement, the measurement being effected after a predetermined time after the other of the two poles has been brought to the second potential by connection to the conductor.

16. A method for reading from a memory arrangement including at least one memory cell in which a resistance value between two poles of the memory cell reflects a memory state of the memory cell, the method comprising:
   connecting one of the two poles to a charge sink with a first potential;
   connecting the other of the two poles to a conductor having a second potential, which lies above the potential of the charge sink; and
   measuring the potential of the conductor, wherein said method further comprises:
   connecting the conductor to a measuring device; and
   releasing the connection of the conductor to the measuring device directly prior to measuring.

17. An intergrated circuit for reading from a memory arrangement including at least one memory cell in which a resistance value between two poles of the memory cell reflects a memory state of the memory cell, the intergrated circuit comprising:
   a charge source with a first potential for connecting to one of the two poles;
   a conductor having a second potential, which lies below the potential of the charge source, for connecting to the other of the two poles; and
   a measuring device for measuring the potential of the conductor, wherein said intergrated circuit further comprises:
   a capacitive coupling device that brings the conductor to the second potential by a voltage pulse.

18. An intergrated circuit for reading from a memory arrangement including at least one memory cell in which a resistance value between two poles of the memory cell reflects a memory state of the memory cell, the integrated circuit comprising:
- a charge source with a first potential for connecting to one of the two poles;
- a conductor having a second potential, which lies below the potential of the charge source, for connecting to the other of the two poles; and
- a measuring device for measuring the potential of the conductor, wherein:
- the first and second potentials are selected such that the magnitude of their difference does not exceed the sum formed from the magnitude of a predetermined positive threshold voltage and the magnitude of a predetermined negative threshold voltage,
- the positive threshold voltage is a positive voltage that when applied to the two poles of the memory cell, as seen statistically, causes a resistance change that characterizes a change in the memory state of the memory cell, and
- the negative threshold voltage is a negative voltage that when applied to the two poles of the memory cell, as seen statistically, causes a resistance change that characterizes a change in the memory state of the memory cell.

19. An intergrated circuit for reading from a memory arrangement including at least one memory cell in which a resistance value between two poles of the memory cell reflects a memory state of the memory cell, the intergrated circuit comprising;
- a charge source with a first potential for connecting to one of the two poles;
- a conductor having a second potential, which lies below the potential of the charge source, for connecting to the other of the two poles; and
- a measuring device for measuring the potential of the conductor, wherein said intergrated circuit further comprises:
- a two-pole differential amplifier for measuring the potential of the conductor,
- wherein one pole of the differential amplifier is connected to the conductor, and the other pole of the differential amplifier is held at a third potential between the first and second potentials.

20. An intergrated circuit for reading from a memory arrangement including at least one memory cell in which a resistance value between two poles of the memory cell reflects a memory state of the memory cell, the intergrated circuit comprising;
- a charge source with a first potential for connecting to one of the two poles;
- a conductor having a second potential, which lies below the potential of the charge source, for connecting to the other of the two pole; and
- a measuring device for measuring the potential of the conductor, wherein said intergrated circuit further comprises:
- a device that restricts the current flow of the current source or sink to a value less than a predetermined magnitude of a harmful current,
- wherein the harmful current is a current of a magnitude that its flow via the two poles of the memory cell, as seen statistically, causes a resistance change that characterizes a change in the memory state of the memory cell.

21. An intergrated circuit for reading from a memory arrangement including at least one memory cell in which a resistance value between two poles of the memory cell relfects a memory state of the memory cell, the intergrated circuit comprising:
- a charge source with a first potential for connecting to one of the two poles;
- a conductor having a second potential, which lies below the potential of the charge source, for connecting to the other of the two poles; and
- a measuring device for measuring the potential of the conductor, wherein said intergrated circuit further comprises:
- a device that restricts the current flow of the current source or sink to a value less than a predetermined magnitude of a destructive current,
- wherein the destructive current is a current of a magnitude that its flow via the two poles of the memory cell, as seen statistically, causes a permanent damage to the memory cell.

22. An intergrated circuit for reading from a memory arrangement including at least one memory cell in which a resistance value between two poles of the memory cell reflects a memory state of the memory cell, the intergrated circuit comprising:
- a charge source with a first potential for connecting to one of the two poles;
- a conductor having a second potential, which lies below the potential of the charge source, for connecting to the other of the two poles; and
- a measuring device for measuring the potential of the conductor, wherein said intergrated circuit further comprises:
- a device for determining a presumable memory state of the memory cell based on a measurement result of the measurement,
- wherein the measuring device measures after a predetermined time after the other of the two poles has been brought to the second potential by connection to the conductor.

23. An apparatus for reading from a memory arrangement including at least one memory cell in which a resistance value between two poles of the memory cell reflects a memory state of the memory cell, the apparatus comprising:
- a charge sink with a first potential for connecting to one of the two poles;
- a conductor having a second potential, which lies above the potential of the charge sink, for connecting to the other of the two poles; and
- a measuring device for measuring the potential of the conductor, wherein said apparatus further comprises:
- a capacitive coupling device that brings the conductor to the second potential by a voltage pulse.

24. An apparatus for reading from a memory arrangement including at least one memory cell in which a resistance value between two poles of the memory cell reflects a memory state of the memory cell, the apparatus comprising:
- a charge sink with a first potential for connecting to one of the two poles;
- a conductor having a second potential, which lies above the potential of the charge sink, for connecting to the other of the two poles; and
- a measuring device for measuring the potential of the conductor, wherein
- the first and second potentials is selected such that the magnitude of their difference does not exceed the sum formed from the magnitude of a predetermined positive threshold voltage and the magnitude of a predetermined negative threshold voltage, the positive threshold voltage is a positive voltage that when applied to the two poles of the memory cell, as seen statistically, causes a resistance change that characterizes a change in the memory state of the memory cell, and the negative threshold voltage is a negative voltage that when applied to the two poles of the memory cell, as seen statistically, causes a resistance change that characterizes a change in the memory state of the memory cell.

25. An apparatus for reading from a memory arrangement including at least one memory cell in which a resistance value between two poles of the memory cell reflects a memory state of the memory cell, the apparatus comprising:
- a charge sink with a first potential for connecting to one of the two poles;
- a conductor having a second potential, which lies above the potential of the charge sink, for connecting to the other of the two poles; and
- a measuring device for measuring the potential of the conductor, wherein said apparatus further comprises:
- a two-pole differential amplifier for measuring the potential of the conductor,
- wherein one pole of the differential amplifier is connected to the conductor, and the other pole of the differential amplifier is held at a third potential between the first and second potentials.

26. The apparatus as claimed in claim 25, wherein the resistance value of the memory cell reflects a memory state that changes by applying a voltage to the two poles of the memory cell.

27. An apparatus for reading from a memory arrangement including at least one memory cell in which a resistance value between two poles of the memory cell reflects a memory state of the memory cell, the apparatus comprising:
- a charge sink with a first potential for connecting to one of the two poles;
- a conductor having a second potential, which lies above the potential of the charge sink, for connecting to the other of the two poles; and
- a measuring device for measuring the potential of the conductor, wherein said apparatus further comprises:
- a device that restricts the current flow of the current source or sink to a value less than a predetermined magnitude of a harmful current,
- wherein the harmful current is a current of a magnitude that its flow via the two poles of the memory cell, as seen statistically, causes a resistance change that characterizes a change in the memory state of the memory cell.

28. An apparatus for reading from a memory arrangement including at least one memory cell in which a resistance value between two poles of the memory cell reflects a memory state of the memory cell, the apparatus comprising:
- a charge sink with a first potential for connecting to one of the two poles;
- a conductor having a second potential, which lies above the potential of the charge sink, for connecting to the other of the two poles; and
- a measuring device for measuring the potential of the conductor, wherein said apparatus further comprises:
- a device that restricts the current flow of the current source or sink to a value less than a predetermined magnitude of a destructive current,
- wherein the destructive current is a current of a magnitude that its flow via the two poles of the memory cell, as seen statistically, causes a permanent damage to the memory cell.

29. An apparatus for reading from a memory arrangement including at least one memory cell in which a resistance value between two poles of the memory cell reflects a memory state of the memory cell, the apparatus comprising:
- a charge sink with a first potential for connecting to one of the two poles;
- a conductor having a second potential, which lies above the potential of the charge sink, for connecting to the other of the two poles; and
- a measuring device for measuring the potential of the conductor, wherein said apparatus further comprises:
- a device for determining a presumable memory state of the memory cell based on a measurement result of the measurement,
- wherein the measuring device measures after a predetermined time after the other of the two poles has been brought to the second potential by connection to the conductor.

* * * * *